United States Patent
Mei et al.

(10) Patent No.: US 6,379,867 B1
(45) Date of Patent: Apr. 30, 2002

(54) MOVING EXPOSURE SYSTEM AND METHOD FOR MASKLESS LITHOGRAPHY SYSTEM

(75) Inventors: Wenhui Mei, Richardson; Takashi Kanatake, Dallas; Akira Ishikawa, Royse City, all of TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/480,796

(22) Filed: Jan. 10, 2000

(51) Int. Cl.$^7$ .............................. G03F 9/02; G03F 7/00
(52) U.S. Cl. .......................... 430/296; 430/5; 430/396; 430/397; 430/30; 430/311; 355/53; 355/67
(58) Field of Search ........................... 430/296, 5, 396, 430/397, 30, 311; 355/53, 67

(56) References Cited

U.S. PATENT DOCUMENTS

| | | | |
|---|---|---|---|
| 3,534,467 A | 10/1970 | Sach et al. | 29/583 |
| 4,126,812 A | 11/1978 | Wakefield | 313/500 |
| 4,744,047 A | 5/1988 | Okamoto et al. | 364/900 |

(List continued on next page.)

FOREIGN PATENT DOCUMENTS

| | | | |
|---|---|---|---|
| EP | 0 552 953 A1 | | 7/1993 |
| JP | 11-111958 | * | 1/1999 |
| WO | WO 91/10170 | | 7/1991 |

OTHER PUBLICATIONS

Application No. 09/094,761, filed Jun. 15, 1998, entitled: Total Internal Reflection Holography Method and Apparatus for Lithography on A 3–D Spherical Shaped Integrated Circuit , by Karlton Powell, copy of first page of specification, abstract and figure no. 1 (Attorney Docket No. 22397.64).

Application No. 09/107,875, filed Jun. 30, 1998, entitled: Spherical Cell Design for VLSI Circuit Design on a Spherical Semiconductor, by Eiji Matsunaga and Nobuo Takeda, copy of first page of specification, abstract and figure no. 1 (Attorney Docket No. 22397.67).

Application No. 09/348,369, filed Jul. 07, 1999, entitled: Maskless Photolithography System by Wenhui Mei, Takashi Kanatake and Akira Ishikawa, copy of first page of specification, abstract and figur No. 1 (Attornet Docket No. 22397.84.02).

Singh–Gasson, Sangeet et al., Maskless Fabrication of Light–Directed Oligonucleotide Microarrays Using a Digital Micromirror Array, vol. 17, No. 10, Oct. 1999, pp.974–978.

Devitt, Terry , Advanced May Put Gene Chip Technology on Scientists Desktops, http://www.biotech.wise.edu/Education/biotechnews/GeneChip.html, Oct. 7, 1999.

"New Multi–EB Direct Write Concept for Maskless High Throughput", Canon SubMicron Focus, vol. 5, Summer 2000.

Primary Examiner—Mark F. Huff
Assistant Examiner—Deborah Chacko-Davis
(74) Attorney, Agent, or Firm—Haynes and Boone, LLP (57) ABSTRACT

A photolithography system and method for providing a mask image to a subject such as a wafer is provided. The mask images are divided into sub-patterns and sequentially provided to a pixel panel, such as a deformable mirror device or a liquid crystal display. The pixel panel converts each sub-pattern into a plurality of pixel elements. Each of the pixel elements is then simultaneously focused to discrete, non-contiguous portions of the subject through a microlense array. The subject and pixel elements are then moved (e.g., one or both may be moved) and the next sub-pattern in the sequence is provided to the pixel panel. As a result, light can be projected on the subject, according to the pixel elements, to create a contiguous image on the subject.

16 Claims, 6 Drawing Sheets

U.S. PATENT DOCUMENTS

| | | | |
|---|---|---|---|
| 4,879,466 A | 11/1989 | Kitaguchi et al. | 250/370.14 |
| 5,082,755 A | 1/1992 | Liu | 430/5 |
| 5,131,976 A | 7/1992 | Hoko | 156/630 |
| 5,138,368 A | 8/1992 | Kahn et al. | 355/53 |
| 5,269,882 A | 12/1993 | Jacobsen | 156/659.1 |
| 5,281,996 A | 1/1994 | Bruning et al. | 355/77 |
| 5,361,272 A | 11/1994 | Gorelik | 372/50 |
| 5,416,729 A | 5/1995 | Leon et al. | 364/578 |
| 5,431,127 A | 7/1995 | Stevens et al. | 117/75 |
| 5,461,455 A | 10/1995 | Coteus et al. | 355/43 |
| 5,602,620 A * | 2/1997 | Miyazaki et al. | 355/53 |
| 5,691,541 A | 11/1997 | Ceglio et al. | 250/492.1 |
| 5,870,176 A | 2/1999 | Sweatt et al. | 355/53 |
| 5,900,637 A | 5/1999 | Smith | 250/492.22 |
| 5,909,658 A | 6/1999 | Clarke et al. | 702/126 |
| 5,955,776 A | 9/1999 | Ishikawa | 257/618 |
| 5,998,069 A | 12/1999 | Cutter et al. | 430/5 |
| 6,084,656 A | 7/2000 | Choi et al. | 355/71 |
| 6,133,986 A | 10/2000 | Johnson | 355/67 |

* cited by examiner

MOVING EXPOSURE SYSTEM AND METHOD FOR MASKLESS LITHOGRAPHY SYSTEM

BACKGROUND

The present invention relates generally to photographic exposure equipment, and more particularly, to a photolithography system and method, such as can be used in the manufacture of semiconductor integrated circuit devices.

In conventional photolithography systems, the photographic equipment requires a mask for printing a pattern onto a photo resist coated subject. The subject may include, for example, a semiconductor substrate for manufacture of integrated circuits, metal substrate for etched lead frame manufacture, conductive plate for printed circuit board manufacture, or the like. A patterned mask or photomask may include, for example, a plurality of lines, structures, or images. During a photolithographic exposure, the photo resist coated subject must be aligned to the mask very accurately using some form of mechanical control and sophisticated alignment mechanism.

With conventional photolithography, the patterned masks are typically very expensive. In addition, the photomasks are characterized as requiring a very long mask purchase lead time. The long mask purchase lead time is not very helpful when a short product development cycle is desired. Further, if a particular mask design is found to require a design change in the pattern, no matter how small of a then mask modification cost and a respective lead time to implement the required change can cause serious problems in the manufacture of the desired product.

A mask is typically made at a mask printing manufacturer or mask shop, for example, with the use of a very sophisticated electron beam direct writing system or photography system to print a desired design pattern onto a transparent substrate material, such as a quartz glass plate. In addition, highly sophisticated computer systems may also be necessary. Masks are, in general, delicate items that must be continually handled. For one, a photolithography system must continually change between masks for different products, or for different portions or layers on a specific product. Also, masks must be stored and handled for routine maintenance operations on the photolithography system. As a result, using masks can be add significant cost to the overall photolithography process.

Figure 1:
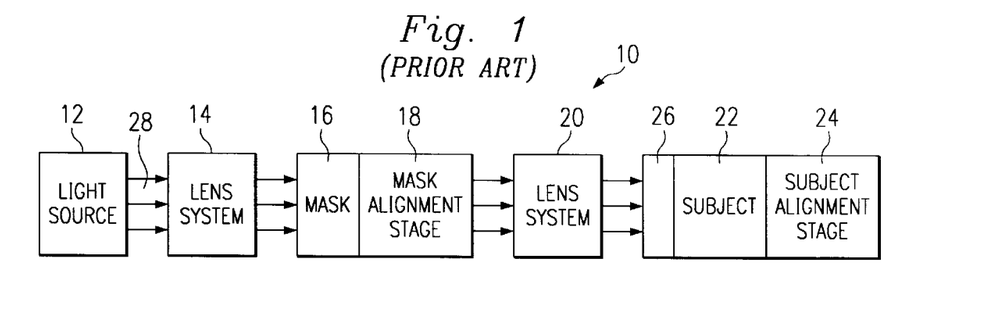
FIG. 1 illustrates a conventional photolithography system including a printed mask for use in the exposure of a photo resist coated subject.

Referring briefly now to FIG. 1, a conventional photolithography system 10 is illustrated. The photolithography system 10 includes a light source 12, a first lenses system 14, a printed mask 16, a mask alignment system 18, a second lenses system 20, a subject 22, and a subject alignment system 24. The subject 22 may include a photo resist coating 26 disposed thereon. During photolithography, light 28 emanates from the light source 12, through the first lenses system 14, the printed mask 16, the second lenses system 20, and onto the subject 22. In this manner, the pattern of the mask 16 is projected onto the resist coating 26 of the subject 22.

The mask 16 must be aligned to the subject 22. At a minimum, there are five different alignments. These alignments may be accomplished by one or both of the mask alignment system 18 and the subject alignment system 24. For the sake of example, the subject 22 may be a wafer with one or more alignment marks that must align to marks on the mask. First of all, the wafer 22 must be horizontally aligned (in both an x-direction and a y-direction) to center the alignment marks with on the wafer and mask. The wafer 22 must also be rotationally aligned (rotated) and must be vertically aligned (in a z-direction, e.g., placed in focus). The wafer 22 and/or the mask 16 must also be tilt aligned so that all of the edges of the wafer are in focus.

As the demand for integrated circuits with more logic and/or higher speed (e.g., with increased memory and processing capability) rises, the individual feature sizes (e.g., line width) on the integrated circuits must be reduced. To achieve this reduced line width, the photolithography equipment used for imaging these patterns must have higher and higher resolution. Simultaneously, the larger physical size of the integrated circuits demands that the higher resolution be achieved over a larger image field.

The photolithography system 10 achieves relatively high resolution by using the first and second lenses system 14, 20, so that the pattern on the mask 16 can be reduced by a factor of 5× to 10× on the subject 22. Since such a lense reduction system is capable of high resolution only over a limited image field, the exposure region is confined to specific step "sites." That is, the entire subject 22 is processed by exposing a site, stepping to the next site, and repeating the process. In these prior art systems, known as step and repeat systems, the limiting performance capability is determined by the reduction projection lens assembly, which typically consists of a large number of individual lens elements. As the resolution requirements increase, the design complexity of the corresponding lens assembly increases. Furthermore, a complicated lens system is required to compensate for the effects of the undesired diffracted light.

Therefore, it is desired to eliminate or reduce the problems in the art associated with conventional masks.

It is also desired to provide a lithographic system and method with increased resolution.

It is further desired to provide an improved photolithography alignment system, such improvement being in alignment accuracy, alignment speed, automation, and/or other requirements of alignment.

It is still further desired to provide an improved photolithography system where light diffraction problems associated with conventional photolithographic masks are reduced or eliminated.

SUMMARY

A technical advance is achieved by a novel system and method for photolithography which provides a moving digital image onto specific sites on a subject. In one embodiment, the method projects a pixel-mask pattern onto a subject such as a wafer. The method provides a sub-pattern to a pixel panel pattern generator such as a deformable mirror device or a liquid crystal display. The pixel panel provides a plurality of pixel elements corresponding to the sub-pattern that may be projected onto the subject.

Each of the plurality of pixel elements is then simultaneously focused to discrete, non-contiguous portions of the subject. The subject and pixel elements are then moved (e.g., by vibrating one or both of the subject and pixel elements) and the sub-pattern is changed responsive to the movement and responsive to the pixel-mask pattern. As a result, light can be projected into the sub-pattern to create the plurality of pixel elements on the subject, and the pixel elements can be moved and altered, according to the pixel-mask pattern, to create a contiguous image on the subject.

In some embodiments, the method also removes diffracted light from each of the pixel elements by passing the pixel elements through a grating or shadow mask.

In some embodiments, the step of focusing simultaneously creates a plurality of coplanar focal points on the subject. This can be accomplished, for example, through a microlense array.

In some embodiments, the pixel-mask pattern is aligned with the subject prior to providing the sub-pattern to the pattern generator by adjusting the sub-pattern before it is provided.

In some embodiments, the step of changing the pixels is accomplished by sequentially providing a plurality of bit maps. Each of the bit maps is used to create the sub-patterns.

In some embodiments, the subject can be divided into a plurality of contiguous micro-sites. The pixel elements are moved relative to the subject by simultaneously scanning in a predetermined fashion throughout each of the microsites, so that the pixel-mask pattern eventually creates a contiguous image across the plurality of contiguous micro-sites.

In some embodiments, the pixel elements are moved by a vibrating mirror and the pixels are changed corresponding to the vibration of the mirror.

Therefore, an advantage of the present invention is that it eliminates or reduces the problems in the art associated with conventional masks.

Another advantage of the present invention is that it provides a lithographic system and method with increased resolution.

Yet another advantage of the present invention is that it provides an improved photolithography alignment system, such improvement being in alignment accuracy, alignment speed, automation, and/or other requirements of alignment.

Still another advantage of the present invention is that it provides an improved photolithography system where light diffraction problems associated with conventional photolithographic masks are reduced or eliminated.

BRIEF DESCRIPTION OF THE DRAWINGS

These and additional advantages of the present invention will become more apparent upon a detailed description of the best mode for carrying out the invention as rendered below. In the description to follow, reference will be made to the accompanying drawings, in which.

DETAILED DESCRIPTION

The present disclosure relates to exposure systems, such as can be used in semiconductor photolithographic processing. It is understood, however, that the following disclosure provides many different embodiments, or examples, for implementing different features of one or more inventions. Techniques and requirements that are only specific to certain embodiments should not be imported into other embodiments. Also, specific examples of components and arrangements are described below to simplify the present disclosure. These are, of course, merely examples and are not intended to limit the invention from that described in the claims.

Figure 2:
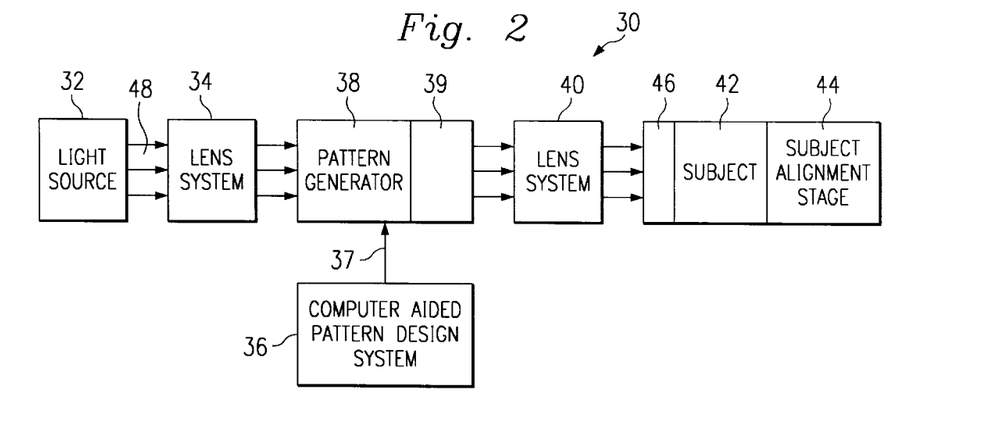
FIG. 2 illustrates a maskless photolithography system including a pattern generator and mask pattern design system according to one embodiment of the present invention.

With reference now to FIG. 2, the maskless photolithography system 30 of the present disclosure includes a light source 32, a first lenses system 34, a computer aided pattern design system 36, a pixel panel 38, a panel alignment stage 39, a second lenses system 40, a subject 42, and a subject stage 44. A resist layer or coating 46 may be disposed on the subject 42. The light source 32 provides a collimated beam of light 48 which is projected upon the first lenses system 34 and onto the pixel panel 38. The pixel panel 38 is provided with digital data via suitable signal line(s) 37 from the computer aided pattern design system 36 to create a desired pixel pattern (the pixel-mask pattern). The pixel-mask pattern may be available and resident at the pixel panel 38 for a desired, specific duration. Light emanating from (or through) the pixel-mask pattern of the pixel panel 38 then passes through the second lenses system 40 and onto the subject 42. In this manner, the pixel-mask pattern is projected onto the resist coating 46 of the subject 42. Any modifications and/or changes required in the pixel-mask pattern can be made using the computer aided pattern design system 36. As a result, the need for fabrication of a new patterned printed mask, as would be required in conventional photolithography systems, is eliminated by the photolithography system 30 of the present disclosure.

Figure 3:
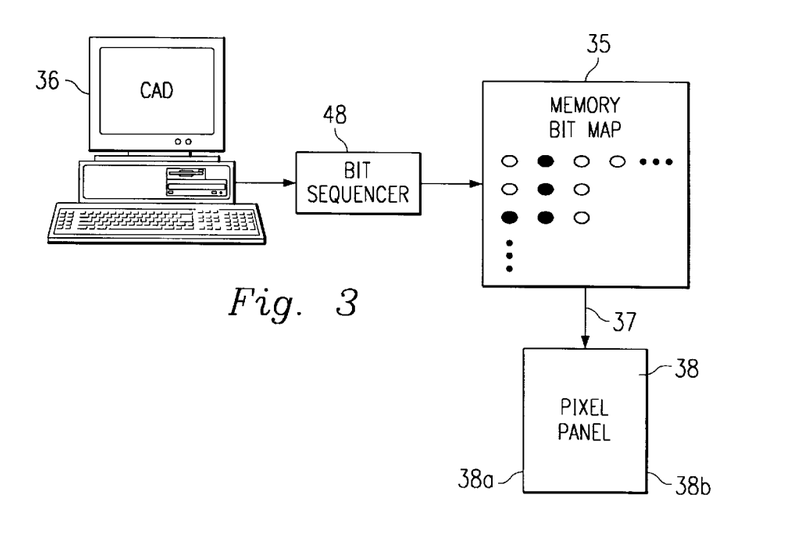
FIG. 3 illustrates the pattern generator and mask pattern design system of FIG. 2 in further detail.

Referring now to FIG. 3, the computer aided mask design system 36 can be used for the creation of the digital data for the pixel-mask pattern. The digital data may, for example, be stored in memory in the form of a bit map 35 or the like. The bit map 35 can include individual pixel data, which is subject to easy modification as may be required for the development of a particular integrated circuit design and/or mask pattern design. The modification can also be used to change entire pixel-mask patterns, such as is required for processing different devices or different layers of a device. The computer aided pattern design system 36 may also include computer aided design (CAD) software similar to that which is currently used for the creation of mask data for use in the manufacture of a conventional printed mask. With the use of the computer aided pattern design system 36, any bit can be easily changed or its location moved in a particular pixel-mask pattern. Therefore, any given pixel-mask pattern can be changed, as needed, almost instantly with the use of an appropriate instruction from the computer aided pattern design system 36.

The photolithography system 30 of FIG. 2 uses two alignment systems: the panel alignment stage 39, and the subject stage 44. However, in some embodiments, certain alignment aspects can be handled by the arrangement of the pixel-mask pattern on the pixel panel 38. For example, the alignment may be accomplished by moving the pixel-mask pattern on the pixel panel 38 accordingly. Certain alignments (such as tilt) may, however, still need some manual type of alignment. It is understood, however, that different embodiments may require different types of manual alignment, or none at all.

Referring again to FIG. 3, the present photolithography system 30 advantageously overcomes the requirement for both precise and very accurate mask alignment and subject alignment systems by including an ability to make accurate and precise pattern alignment adjustments electronically via a suitable computer assisted alignment using the computer aided pattern design system 36. That is, the pixel-mask pattern can be modified readily for obtaining a prescribed alignment, for example, by the shifting the bit map 35 as needed to obtain the desired alignment.

As discussed above, the method and system embodiments of the present disclosure include programmable mask pattern generation with the use of the computer aided pattern design system 36 and pixel panel 38. That is, the pixel-mask pattern to be transferred to the photo resist coated surface of the subject 42 is a programmable mask pattern. Thus, with a programmable mask pattern, any portion of the pattern on the subject 42 can be manipulated and/or changed as desired for rendering of desired changes as may be needed, furthermore, on a significantly reduced cycle time.

In some embodiments, the computer aided pattern design system 36 includes a bit sequencer 48 with a clocking system and an extra buffer. The bit sequencer 48 can be used for sequencing "sub-patterns" to the bit map 35, and thus to the pixel panel 38. Sub-patterns are portions of the pixel-mask pattern, but not necessarily contiguous portions. The clocking system is used for synchronizing the sub-patterns with a vibration movement of the system 30. The extra buffer is used to store additional sub-patterns for the pixel-mask pattern. By using the bit sequencer, the eventual pixel-mask pattern projected onto the subject 42 can actually be several times more detailed than the pixel panel 38. Operation of the bit sequencer 48, including the use of sub-patterns, will become more evident with further discussion of FIGS. 6–12, below.

In some embodiments, the photolithography system 30 includes a liquid crystal display panel for use as the pixel panel 38 (FIG. 3). With the liquid crystal display ("LCD") panel, light passes through the display panel and onto the subject 42 being exposed with the mask pattern. That is, light enters a first side 38a of the LCD panel 38 and emanates from an opposite side 38b of the LCD panel with the pixel-mask pattern information contained therein. The bit map for the pixel-mask pattern information is provided to the LCD panel via the signal line(s) 37 from the computer aided mask pattern design system 36.

In another embodiment, the photolithography system 30 includes a micro mirror device for use as the pixel panel 38. With the micro mirror device, light is reflected according to the pattern of pixels controlled according to a prescribed pixel-mask pattern received from the computer aided mask design system 36. The light reflecting from the micro mirror device thus contains the desired pixel-mask pattern information.

Such a micro mirror array may include any suitable light valve, for example, such as that used in projection television systems and which are commercially available. The light valves are also referred to as deformable mirror devices or digital mirror devices ("DMD"). One example of a DMD is illustrated in U.S. Pat. No. 5,079,544 and patents referenced therein, in which the light valve consists of an array of tiny movable mirror-like pixels for deflecting a beam of light either to a display screen (ON) or away from the display optics (OFF). In one embodiment, the DMD includes an array of 800×600 micro-mirror pixels. The pixels of the light valve device are also capable of being switched very rapidly. The light valve is used to modulate light impinging thereon in accordance with a mask pattern information signal 37 provided by the computer aided pattern design system 36. Thus, with the use of the light valve, the photolithography system 30 of the present disclosure can implement changes in the mask pattern in a relatively quick manner. In addition, the DMD reflects light, thus no appreciable loss in intensity occurs when the patterned light is projected upon the desired subject during the lithographic mask exposure.

With respect to providing a given mask pattern/subject alignment, according to an embodiment of the present disclosure, the mask pattern is shifted in one or more directions for achieving a desired mask alignment on the subject. Alignment is accomplished with the assistance of the computer aided pattern design system 36. Adjustments in alignment are carried out electronically in the pixel-mask pattern information provided to the light valve. Adjustments in pattern alignment can thus be easily accomplished.

Figure 4:
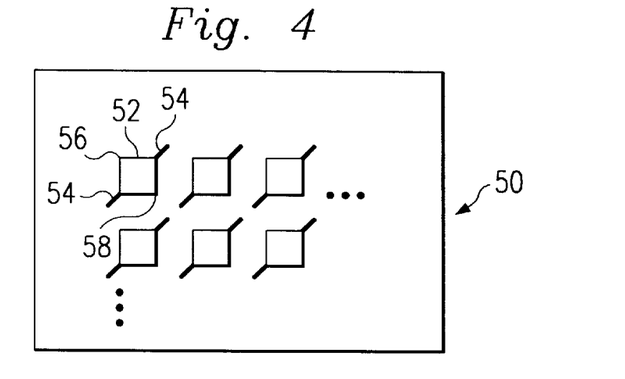
FIG. 4 is a schematic plan view of the surface of a deformable mirror device (DMD) type light valve or micro mirror array showing the orientation of the hinges of the individual pixels.

FIG. 4 illustrates a light valve 50 in the form of a DMD having an array of reflective pixels 52. Each pixel 52 is mounted so as to be pivotable about torsion hinges 54 which are located at two diagonal corners of each pixel. In operation, when an appropriate ON voltage is applied to pixel 52, the upper lefthand corner 56 of the pixel 52 will move upwardly from the plane of the DMD 50 while the lower right-hand corner 58 will move downwardly. Similarly, when an OFF voltage is applied, pixel 52 will pivot about torsion hinges 54 so that corner 56 moves downwardly and corner 58 moves upwardly. Thus the ON and OFF positions comprise two distinct movements of each pixel 52. Generally, pixels 52 can be pivoted by 10° to either side of planar. In the ON position, the incident illumination is reflected into the aperture of the second lenses system. In the OFF position, the incident illumination is reflected outside the aperture of the second lenses system and thus does not reach the subject being exposed. The DMD 50 may also include a so called "hidden hinge" configuration in which the hinges for the individual pixels are disposed underneath the pixels.

Figure 5:
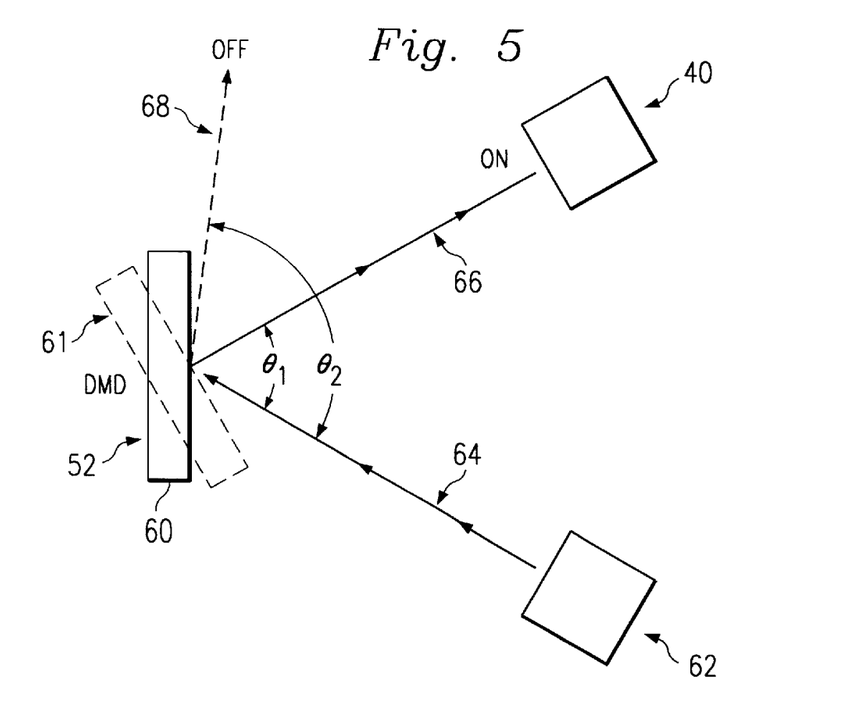
FIG. 5 is a diagram illustrating the angular separation of the incident, ON, and OFF light beams of a micro mirror pixel of a light valve for use with the maskless photolithography system of FIG. 2.

FIG. 5 illustrates the light path resulting from the switching of pixels 52. In FIG. 5, the dotted line 60 illustrates the planar position of pixel 52 when pivoted into its ON position and dotted line 61 illustrates the planar position of pixel 52 when pivoted into its OFF position. An illumination system schematically illustrated at 64 (e.g., from the light source 32 of FIG. 2) provides a beam of incident light 64 on the surface of each pixel 52. When pixel 52 is in the ON position 60, the incident beam 64 will be reflected as a beam 66 to the second lenses system 40 which will project beam 66 onto the subject 42 being exposed. When pixel 52 is activated and pivoted into its OFF position 61, incident beam 64 will be reflected to an "OFF" beam 68 which is outside of the angle of acceptance of the second lenses system 40, so that no light will reach the subject from the OFF position of the pixel 52.

In the above described embodiments, a given resolution of the maskless lithography system 30 is dependent upon the particular optical system used for the first and second optical lenses systems, 34 and 40, respectively. In addition, the number of pixels of a given pixel panel 38 or light valve for example, corresponding to the number of pixels of the liquid crystal display or that of the micro mirror array, also influences the resolution of the maskless lithography system 30 of the present disclosure. For a fixed area, the larger the number of pixels and/or increased magnification, the greater the resolution of the lithography system 30.

With the use of either of the two pattern generation methods (LCD or micro mirror array) as discussed herein for creating a mask pattern under computer control, the lithography system 30 achieves a significant performance improvement over conventional lithography systems. Also, with the present embodiments, conventional photolithography masks are not required. The lithography system 30 of the present disclosure thus advantageously eliminates various matters and procedures associated with the handling, cleaning, changing, and storing traditional masks which are used in conventional photolithography systems. Furthermore, the photolithography system cost is significantly reduced, resulting from the elimination of the requirement for a precision mask stage and alignment system.

Figure 6:
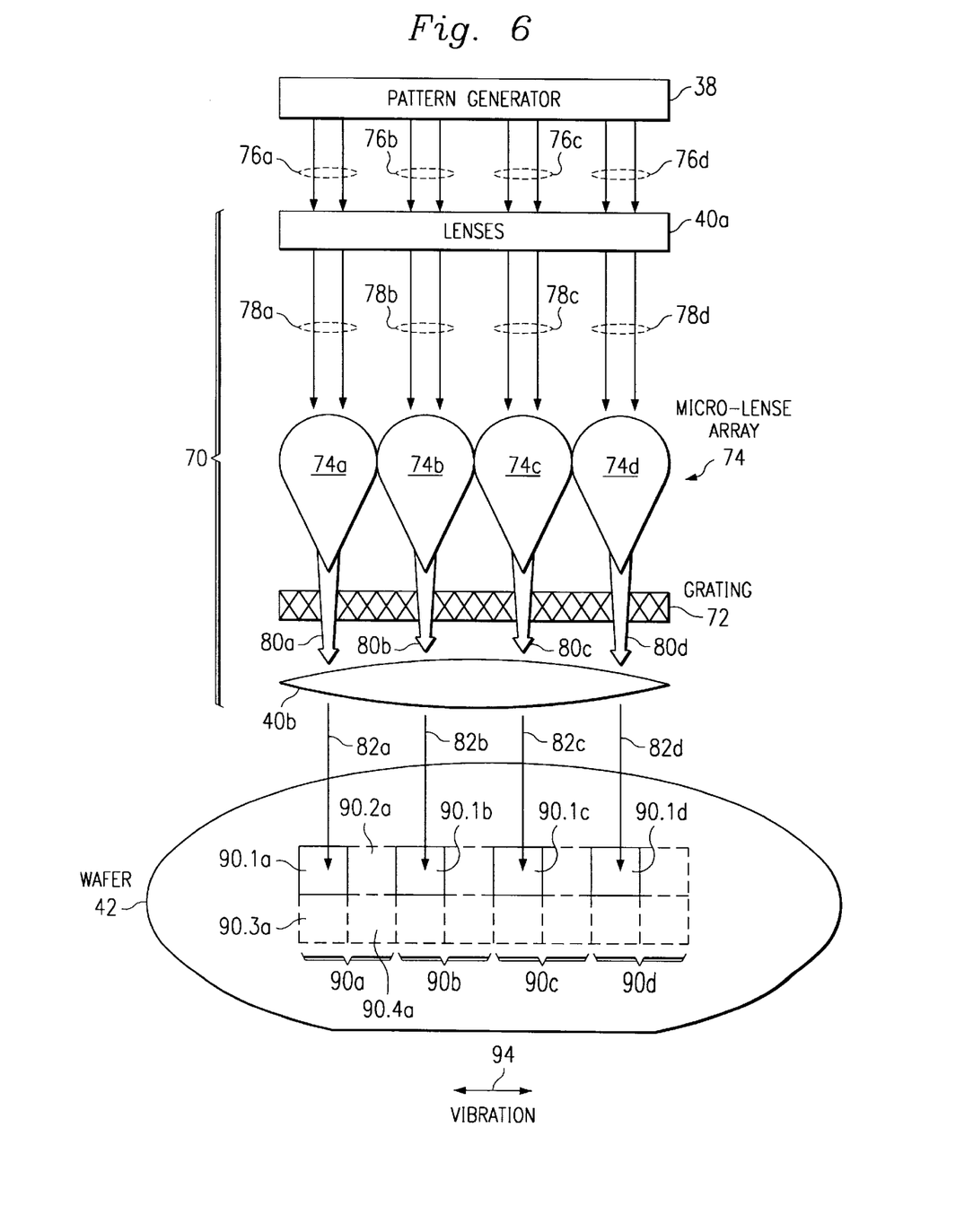
FIG. 6 illustrates a side, cross-sectional view of one embodiment of the maskless photolithography system of FIG. 2 utilizing a microlense array.

Referring now to FIG. 6, in another embodiment of the present invention, the photolithography system 30 utilizes a unique optic system 70 in addition to the lense system 40. It is understood that the lense system 40 is adaptable to various components and requirements of the photolithography system 30, and one of ordinary skill in the art can select and position lenses appropriately. For the sake of example, a group of lenses 40a and an additional lense 40b are shown in the optic system 70.

The optic system 70 includes a grating 72 and a microlense array 74. The grating 72 may be a conventional shadow mask device that is used to eliminate and/or reduce certain bandwidths of light and/or diffractions between individual pixels of the pixel panel 38. The grating 72 may take on various forms, and in some embodiments, may be replaced with another device or not used at all.

The microlense array 74 is a compilation of individual microlenses. In some embodiments, there are as many individual lenses as there are pixels in the pixel panel 38. For example, if the pixel panel 38 is a DMD with 600×800 pixels, then the microlense array 74 may have 600×800 microlenses. In other embodiments, the number of lenses may be different from the number of pixels in the pixel panel 38, so that the arrangement of the design in the pixels can be modified to account for alignment, as discussed above. For the sake of simplicity, only one row of four individual lenses 74a, 74b, 74c, 74d will be illustrated. In the present embodiment, each of the individual lenses 74a, 74b, 74c, 74d is in the shape of a rain drop. This shape provides specific diffraction benefits that will be discussed below. It is understood, however, that shapes other than rain drops may also be used.

Similar to the lense system 40 of FIG. 2, the optic system 70 is placed between the pixel panel 38 and the subject 42. For the sake of example, in the present embodiment, if the pixel panel 38 is a DMD device, light will (selectively) reflect from the DMD device and towards the optic system 70. If the pixel panel 38 is a LCD device, light will (selectively) flow through the LCD device and towards the optic system 70. To further exemplify the present embodiment, the pixel panel 38 includes one row of elements (either mirrors or liquid crystals) for generating four pixels.

In continuance with the example, four different light beams 76a, 76b, 76c, 76d are projected from each of the pixels of the pixel panel 38. In actuality, the light beams 76a, 76b, 76c, 76d are pixel elements that may be either ON or OFF at any particular instant (meaning the light beams exist or not, according to the pixel-mask pattern), but for the sake of discussion all the light beams are illustrated.

The light beams 76a, 76b, 76c, 76d pass through the lense system 40a and are manipulated as required by the current operating conditions. As discussed earlier, the use of the lense system 40a and 40b are design options that are well understood in the art, and one or both may not exist in some embodiments. The light beams 76a, 76b, 76c, 76d that are manipulated by the lense system 40a are designated 78a, 78b, 78c, 78d, respectively.

The light beams 78a, 78b, 78c, 78d then pass through the microlense array 74, with each beam being directed to a specific microlense 74a, 74b, 74c, 74d, respectively. The light beams 78a, 78b, 78c, 78d that are manipulated by the microlense array 74 are designated 80a, 80b, 80c, 80d, respectively. As illustrated in FIG. 6, each of the light beams 80a, 80b, 80c, 80d are being focused to focal points 82a, 82b, 82c, 82d for each pixel element. That is, each pixel element from the pixel panel 38 is manipulated until it focuses to a specific focal point. It is desired that the focal points 82a, 82b, 82c, 82d exist on the subject 42. To achieve this goal, the lense 40b may be used in some embodiments to refocus the beams 80a, 80b, 80c, 80d on the subject 42. FIG. 6 illustrates focal points 82a, 82b, 82c, 82d as singular rays, it being understood that the rays may not indeed be focused (with the possibility of intermediate focal points, not shown) until they reach the subject 42.

The subject 42 can be divided into several different exposure sites. The relative size and proximity of the exposure sites may be different for different embodiments. In some embodiments, the exposure sites are directly adjacent to each other. An example of these directly adjacent exposure sites are sites 90a, 90b, 90c, 90d. In other embodiments, the exposure sites are created from multiple "mini-sites." In an example, the exposure site 90a may consist of four mini-sites 90.1a, 90.2a, 90.3a, and 90.4a. Likewise, each of the sites 90b, 90c, and 90d may also consist of four mini-sites. It is understood that in some embodiments, the sites 90a–90d and/or the corresponding mini-sites (if applicable) may have some overlap between adjacent sites to facilitate electrical connections between the sites.

The sites 90a–90d may, in some embodiments, cover the entire surface of the subject 42. In other embodiments, the sites 90a–90d may only cover a portion of the surface. In these latter embodiments, the-maskless photolithography system 30 may step and repeat so that the entire surface of the subject 42 is eventually exposed. In the embodiments which use the mini-sites, a certain stepper-like movement, referred to as "mini-steps," may be used. That is, initially mini-sites 90.1a, 90.1b, 90.1c, and 90.1d are exposed. Then, the maskless photolithography system 30 performs a mini-step to expose a next group of mini-sites. This process is repeated until each mini-site in a particular site (e.g., mini-sites 90.1a, 90.2a, 90.3a, and 90.4a all of site 90a) have been exposed. The maskless photolithography system 30 may then step and repeat to another portion of the subject 42, if required. For the sake of clarity, the following disclosure will concentrate on the sites 90a–90d, it being understood that the mini-sites behave identically, except for the extra mini-step requirements.

The sites 90a, 90b, 90c, 90d are directly associated with the light beams 82a, 82b, 82c, 82d, respectively, from the microlenses 74a, 74b, 74c, 74d, respectively. Also, each of the sites 90a, 90b, 90c, 90d are exposed simultaneously. However, the entirety of each site 90a, 90b, 90c, 90d is not exposed at the same time. Instead, a modified scanning action is performed to expose the entirety of each site. The modified scanning is achieved by a relative movement between the subject 42 and the light beams 82a, 82b, 82c, 82d from the pixel panel 38. This relative movement may be achieved by vibrating the subject 42, represented by an arrow 94. The vibration 94 may not simply be back and forth, but instead may be more involved, as discussed below.

Figure 7:
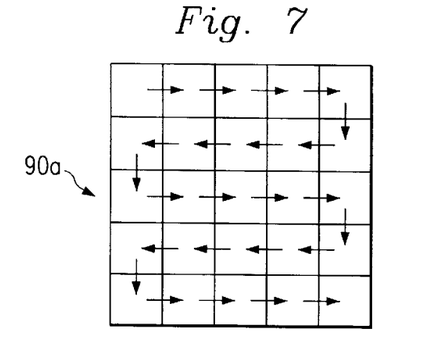
FIG. 7 illustrates an exemplary modified scanning action for the maskless photolithography system of FIG. 6

Referring to FIG. 7, one example of a modified scanning action is illustrated for the site 90a. The site 90a is separated into a plurality of pixel-sites (differentiated from mini-sites). For the sake of example, the site 90a is illustrated with twenty-five pixel-sites A–Y. Each pixel-site of the site 90a is (selectively) exposed by the light beam 82a from the lense 74a. The value of the light beam 82a may change (ON or OFF) corresponding to a specific bit of the bit map 35 (holding the current sub-pattern for the pixel-mask pattern, FIG. 3). As the light beam 82a continues its modified scanning action across the site 90a, the specific bit (and thus the light beam 82a) may change because the sub-pattern in the bit map 35 is changing. The changing of the sub-pattern in the bit map 35 is timed with the modified scanning action by the bit sequencer 48 (FIG. 3). So eventually, the site 90a is exposed with twenty-five bits of information.

The pixel-sites A–Y may be sequentially exposed in any desired sequence or order. It is understood that FIG. 7 illustrates the exposure sequence as a zigzag progression, but spiral sequences, diagonal sequences, and other sequences may also be used. The desired order must correspond, however, to the sequence of sub-patterns provided to the bit map 35. In other words, the stream of digital data coming from the computer system 36 (FIG. 3) must immediately correspond with the relative movement of the subject 42 and the light beam 82a. In some embodiments, the light beam 82a may be pulsed so that there is no blurring between individual pixel-sites. The pulsing may be achieved in various manners, such as from the light source 32 (FIG. 2) or the pixel panel 38 turning all pixels OFF between movements to each pixel-site.

Figure 8A:
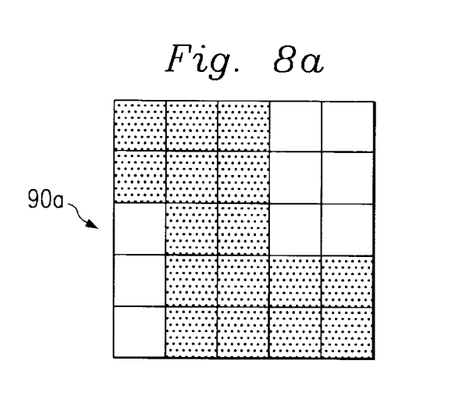
FIGS. 8a and 8b illustrate exemplary patterns produced by the modified scanning action of FIG. 7.
Figure 8B:
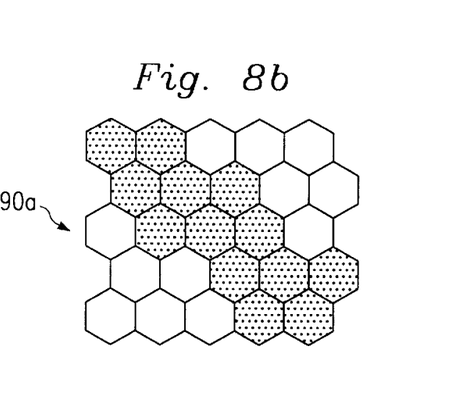

Referring also to FIG. 8a, for the sake of example, a pattern is illustrated on the site 90a. The pattern may be a description of a metal line 92 being exposed on the subject 42. It can be seen that with square shaped pixel-sites, the diagonal shaped metal line 92 may be difficult to implement while maintaining certain fabrication requirements. (e.g., a fabrication process may require a minimum line width be maintained for any metal lines). Referring to FIG. 8b, instead of square shaped, the pixel-sites may be differently shaped, such as hexagonal, to produce a metal line 94. This hexagonal shape allows the metal line to meet the fabrication requirements without consuming as much space as the metal line 92 (FIG. 8a).

Figure 9:
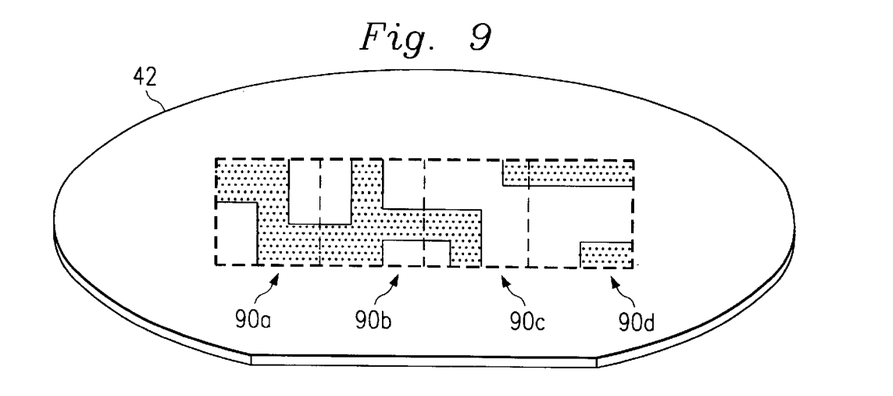
FIG. 9 illustrates an exemplary pattern produced on the subject of the maskless photolithography system of FIG. 6.

Referring to FIG. 9, as stated above, each of the sites 90a, 90b, 90c, 90d is simultaneously exposed. Continuing with the example from FIG. 8a, an overall mask pattern is eventually created on the subject 42 by connecting the patterns from each of the sites 90a, 90b, 90c, 90d. It is also understood that the sites 90a, 90b, 90c, 90d may overlap to facilitate the connection of the patterns.

Figure 10:
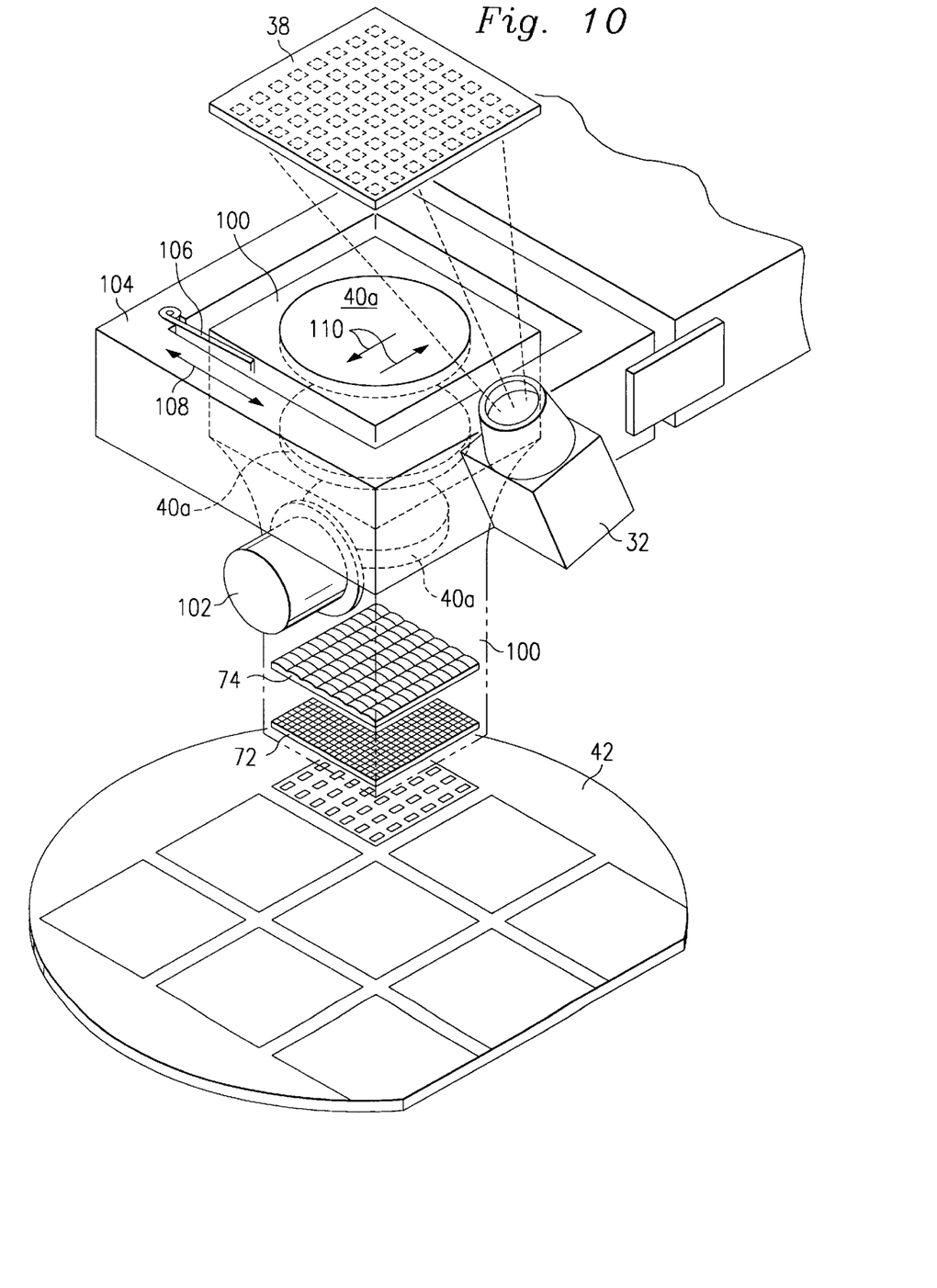
FIG. 10 is an isometric view of another embodiment of the maskless photolithography system of FIG. 6.

Referring to FIG. 10, the maskless photolithography system 30 is shown with more detail for the sake of reference. In this embodiment, the light 32 (which may have one or more lenses included therewith), the pixel panel 38, the lense system 40a, the microlense array 74, and the grating 72 are mounted together on a vibrating structure 100. The vibrating structure 100 is also connected to two piezo electric vibrators 102 for moving the structure, and thus all the components mounted to the structure, according to the modified scanning action sequence. The vibrating structure 100 is connected to a stationary structure 104 through one or more leaf springs 106. The first vibrator 102 may operate at a higher frequency represented by arrow 108, while the second vibrator (not shown) may operate at a slower frequency represented by arrows 110.

Figure 11:
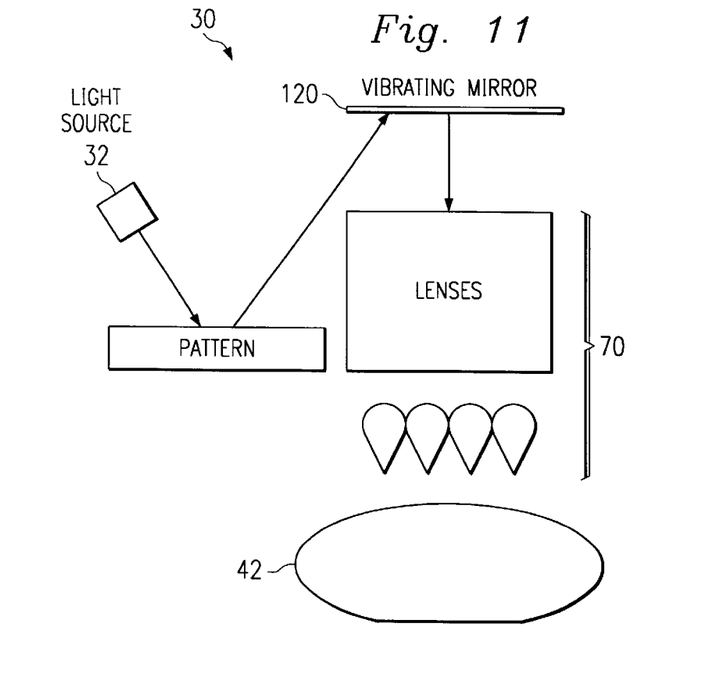
FIGS. 11 and 12 illustrate simplified, cross-sectional views of yet more embodiments of the maskless photolithography system of FIG. 6.
Figure 12:
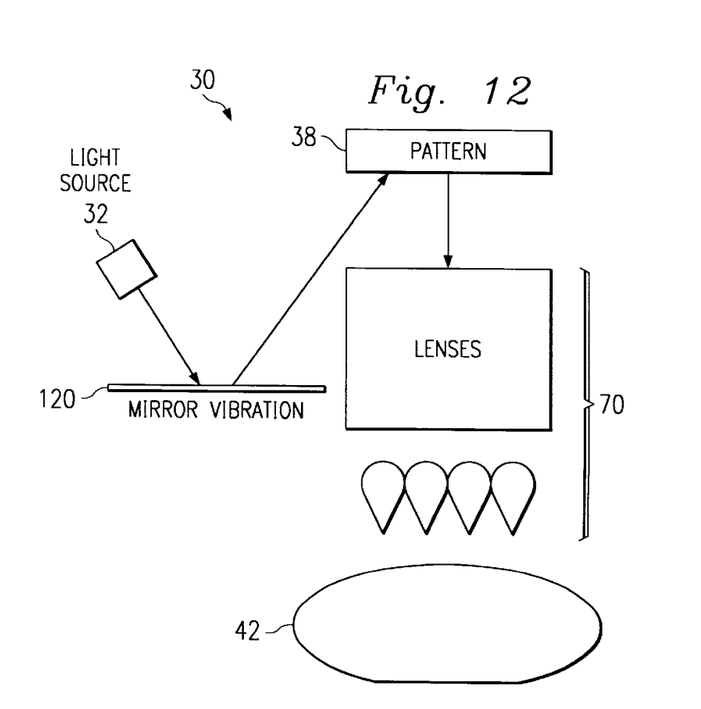

Referring to FIGS. 11 and 12, certain embodiments achieve the relative motion between the subject 42 and the light beams 82a–82d (FIG. 6) by moving the pixel-mask pattern within the system. Referring specifically to FIG. 11, a vibrating mirror 120 can be positioned between the pixel panel 38 and the optic system 70. In one embodiment, the vibrating mirror 120 may be a Silicon Micro Optical Scanner from The Nippon Signal Co., Ltd. of Tokyo, Japan. Referring specifically to FIG. 12, the vibrating mirror may also be positioned between the light source 32 and the pixel panel 38. With these embodiments, it is therefore not necessary to vibrate either the subject 42 (e.g., FIG. 6) or the optic system 70 (e.g., FIG. 10). This can make the overall system 30 easier to build and may reduce the amount of stress that may occur on the moving parts.

While the invention has been particularly shown and described with reference to the preferred embodiment thereof, it will be understood by those skilled in the art that various changes in form and detail may be made therein without departing form the spirit and scope of the invention, as set forth in the following claims.

What is claimed is:

1. A method for projecting a pixel-mask pattern onto a subject, the method comprising the steps of:

dividing the subject into a plurality of sites, with each site comprising a plurality of groups of pixel-sites;

dividing the pixel-mask pattern into a plurality of sub-patterns, each sub-pattern being directed to a specific group of pixel-sites in the plurality of sites;

providing one of the sub-patterns to a pixel panel for creating a plurality of pixel elements by selectively manipulating the pixel panel responsive to the provided sub-pattern;

simultaneously focusing the plurality of pixel elements to discrete, non-contiguous pixel sites;

simultaneously moving the plurality of pixel elements relative to the subject; and providing a next one of the sub-patterns to the pixel panel responsive to the movement and responsive to the pixel-mask pattern, so that a first pixel site of a group receives a first value and a second pixel site of the same group receives a second value different from the first value.

2. The method of claim 1 further comprising:

projecting light incident to the pixel panel.

3. The method of claim 1 wherein the pixel panel is a liquid crystal display, and the step of creating a plurality of pixel elements includes selectively manipulating the liquid crystal display responsive to the provided sub-pattern.

4. The method of claim 1 further comprising:

removing diffracted light from each of the pixel elements by passing the pixel elements through a grating.

5. The method of claim 1 wherein the step of moving utilizes a vibrator.

6. The method of claim 5 further comprising:

mechanically linking the vibrator to the subject.

7. The method of claim 1 wherein the step of focusing simultaneously creates a plurality of coplanar focal points on the subject.

8. The method of claim 1 further comprising:

aligning the pixel-mask pattern with the subject prior to providing a sub-pattern to the pixel panel.

9. The method of claim 1 wherein the discrete, non-contiguous pixel-sites of the subject are hexagonal in shape.

10. The method of claim 1 wherein the step of providing the sub-patterns is accomplished by sequentially providing a plurality of bit maps to the pixel panel.

11. The method of claim 1 wherein each site can be divided into a plurality of contiguous mini-sites, with each mini-sites including a portion of the pixel-sites of the respective site, and wherein the pixel elements are moved relative to the subject by sequentially scanning in a predetermined fashion throughout each of the mini-sites, so that the pixel-mask pattern eventually creates a contiguous image across the plurality of contiguous mini-sites.

12. The method of claim 11 wherein the contiguous mini-sites overlap.

13. The method of claim 1 wherein the pixel elements are moved by a vibrating mirror positioned between a light source and the pixel panel, and wherein the pixel element are manipulated responsive to the vibration of the mirror.

14. The method of claim 1 wherein the pixel elements are moved by a vibrating mirror positioned between the pixel panel and the subject, and wherein the pixel element are manipulated responsive to the vibration of the mirror.

15. The method of claim 1 wherein the pixel panel is a deformable mirror device and the step of creating a plurality of pixel elements includes selectively manipulating one or more mirrors in the deformable mirror device responsive to the provided sub-pattern.

16. A method for exposing a pixel-mask pattern on a subject, the method comprising the steps of:

dividing the pixel-mask pattern into a plurality of sub-patterns, each sub-pattern being directed to a specific group of pixel-sites in a plurality of sites on the subject;

providing one of the sub-patterns to a pixel panel for creating a plurality of pixel elements by selectively manipulating the pixel panel responsive to the provided sub-pattern;

simultaneously focusing the plurality of pixel elements to discrete, non-contiguous pixel sites;

simultaneously moving the plurality of pixel elements relative to the subject so that a single pixel element can scan one of the pixel sites during a cycle; and providing a next one of the sub-patterns to the pixel panel responsive to the movement and responsive to the pixel-mask pattern so that within the cycle of a modified scanning movement, a first pixel site of a group receives a first value while the second pixel site of the group receives a second value different from the first value.

* * * * *